(12) United States Patent
Lin et al.

(10) Patent No.: US 12,205,869 B2
(45) Date of Patent: Jan. 21, 2025

(54) METHOD FOR FORMING A SEMICONDUCTOR PACKAGE

(71) Applicant: MEDIATEK INC., Hsin-Chu (TW)

(72) Inventors: You-Wei Lin, Hsinchu (TW); Chih-Feng Fan, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 79 days.

(21) Appl. No.: 18/084,577

(22) Filed: Dec. 20, 2022

(65) Prior Publication Data

US 2023/0123668 A1    Apr. 20, 2023

Related U.S. Application Data

(62) Division of application No. 17/070,885, filed on Oct. 14, 2020, now Pat. No. 11,562,948.

(60) Provisional application No. 62/930,092, filed on Nov. 4, 2019.

(51) Int. Cl.
  *H01L 23/495* (2006.01)
  *H01L 21/56* (2006.01)
  *H01L 21/78* (2006.01)
  *H01L 23/31* (2006.01)

(52) U.S. Cl.
  CPC ........ *H01L 23/49503* (2013.01); *H01L 21/56* (2013.01); *H01L 21/78* (2013.01); *H01L 23/31* (2013.01); *H01L 23/49537* (2013.01); *H01L 23/49575* (2013.01)

(58) Field of Classification Search
  CPC ... H01L 23/49503; H01L 21/56; H01L 21/78; H01L 23/31; H01L 23/49537; H01L 23/49575

USPC .......................................................... 257/676
See application file for complete search history.

(56) References Cited

U.S. PATENT DOCUMENTS

| | | | |
|---|---|---|---|
| 6,872,599 B1 * | 3/2005 | Li | H01L 23/3107 438/15 |
| 2016/0189978 A1 | 6/2016 | Shibasaki | |
| 2017/0271249 A1 | 9/2017 | Kasuya | |
| 2019/0051585 A1 | 2/2019 | Dimaano, Jr. | |

FOREIGN PATENT DOCUMENTS

| | | |
|---|---|---|
| CN | 107946259 A | 4/2018 |
| JP | 2004-207275 A | 7/2004 |
| JP | 2006-165411 A | 6/2006 |
| TW | 201711231 A | 3/2017 |
| TW | 201729377 A | 8/2017 |
| TW | 201830626 A | 8/2018 |

* cited by examiner

*Primary Examiner* — Caleb E Henry
*Assistant Examiner* — Dilinh P Nguyen
(74) *Attorney, Agent, or Firm* — Winston Hsu

(57) ABSTRACT

A semiconductor package includes a die attach pad; a plurality of lead terminals disposed around the die attach pad; a semiconductor die mounted on the die attach pad; a molding compound encapsulating the plurality of lead terminals, the semiconductor die, and the die attach pad; and a step cut sawn into the molding compound along a perimeter of a bottom surface of the semiconductor package. The step cut penetrates through an entire thickness of each of the plurality of lead terminals, whereby each of the plurality of lead terminals has at least an exposed outer end at the step cut.

6 Claims, 10 Drawing Sheets

METHOD FOR FORMING A SEMICONDUCTOR PACKAGE

CROSS REFERENCE TO RELATED APPLICATION

This application is a division of U.S. application Ser. No. 17/070,885, filed on Oct. 14, 2020, which claims the benefit of U.S. Provisional Application No. 62/930,092, filed on Nov. 4, 2019. The contents of these applications are incorporated herein by reference.

BACKGROUND

This invention relates generally to a semiconductor package, and in particular to an improved leadframe chip package secure to physical probing or hardware hacking.

Many integrated circuits are used to store sensitive or confidential information such as personal or financial information. The technology for reverse engineering an integrated circuit (IC) has progressed to the point where the state of individual circuits can be read off of an operating microcircuit. For example, a leadframe chip package such as a quad flat no-lead (QFN) package typically has pins (or perimeter lands) located on the edge of the package and is susceptible to physical probing or hardware hacking.

Protection of integrated circuits from such intrusions, which may allow access to the sensitive or confidential information, is becoming increasingly important. Therefore, there is a constant need in this industry to provide an improved leadframe chip package capable of reducing the ability of a hacker to physically probe an IC package with such perimeter lands.

SUMMARY

It is one object of the invention to provide an improved leadframe chip package with shaded lead terminals.

According to one aspect of the invention, a semiconductor package includes a die attach pad; a plurality of lead terminals disposed around the die attach pad; a semiconductor die mounted on the die attach pad; a molding compound encapsulating the plurality of lead terminals, the semiconductor die, and the die attach pad; and a step cut sawn into the molding compound along a perimeter of a bottom surface of the semiconductor package. The step cut penetrates through an entire thickness of each of the plurality of lead terminals, whereby each of the plurality of lead terminals has at least an exposed outer end at the step cut.

According to some embodiments, the semiconductor die comprises a plurality of input/output (I/O) pads disposed along a perimeter of the semiconductor die, and wherein the plurality of I/O pads of the semiconductor die is electrically connected to the lead terminals by bond wires.

According to some embodiments, the semiconductor package has a thickness greater than 0.4 mm.

According to some embodiments, the step cut has a height greater than the thickness of each of the plurality of lead terminals and a width of about 0.2-0.4 mm.

According to some embodiments, a bottom surface of the die attach pad is exposed from the bottom surface of the semiconductor package.

According to some embodiments, a remaining portion of the molding compound masks a side surface of the lead terminals.

According to another aspect of the invention, a printed circuit board assembly includes a printed circuit board comprising a chip-mounting face; and a semiconductor package mounted on the chip-mounting face. The semiconductor package has a rectangular outline, a top surface, a bottom surface, and four sidewalls between the top surface and the bottom surface.

The semiconductor package includes a die attach pad; a plurality of lead terminals disposed around the die attach pad; a semiconductor die mounted on the die attach pad; a molding compound encapsulating the plurality of lead terminals, the semiconductor die, and the die attach pad; and a step cut sawn into the molding compound along a perimeter of a bottom surface of the semiconductor package. The step cut penetrates through an entire thickness of each of the plurality of lead terminals, whereby each of the plurality of lead terminals has at least an exposed outer end at the step cut.

According to some embodiments, a solder fillet is provided on the exposed outer end at the step cut.

According to some embodiments, the solder fillet does not protrude beyond the four sidewalls of the semiconductor package.

According to some embodiments, the solder fillet is in direct contact with the exposed outer end and has a half-spherical profile or a curved outer surface.

According to some embodiments, the exposed outer end and the solder fillet are shaded by the molding compound at the step cut.

According to some embodiments, a remaining portion of the molding compound masks a side surface of the lead terminals.

According to another aspect of the invention, a method for fabricating a semiconductor package is provided. A leadframe strip populated with a plurality of leadframes is provided. Each of the plurality of leadframes comprises a die attach pad supported in a central region and lead terminals disposed around the die attach pad. A semiconductor die is mounted on the die attach pad. The semiconductor die is electrically coupling with the lead terminals. The lead terminals, the semiconductor die, and the die attach pad are encapsulated with a molding compound. A step cut is sawn into the molding compound along a perimeter around the lead terminals using a step cut saw width. A sawing process is performed to saw through the molding compound along the step cut using saw width, wherein the step cut saw width is wider than the saw width.

According to some embodiments, the semiconductor die comprises a plurality of input/output (I/O) pads disposed along a perimeter of the semiconductor die, and wherein the plurality of I/O pads of the semiconductor die is electrically connected to the lead terminals by bond wires.

According to some embodiments, the leadframes comprise half-etched regions between the lead terminals.

According to some embodiments, the lead terminals are connected by connecting portions, and wherein the half-etched regions are disposed under the connecting portions.

According to some embodiments, the molding compound within the half-etched regions is removed, and the connecting portions are removed when sawing the step cut into the molding compound.

According to some embodiments, the step cut saw width is approximately 0.9 mm and the saw width is approximately 0.2-0.4 mm.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DETAILED DESCRIPTION

Figure 1:
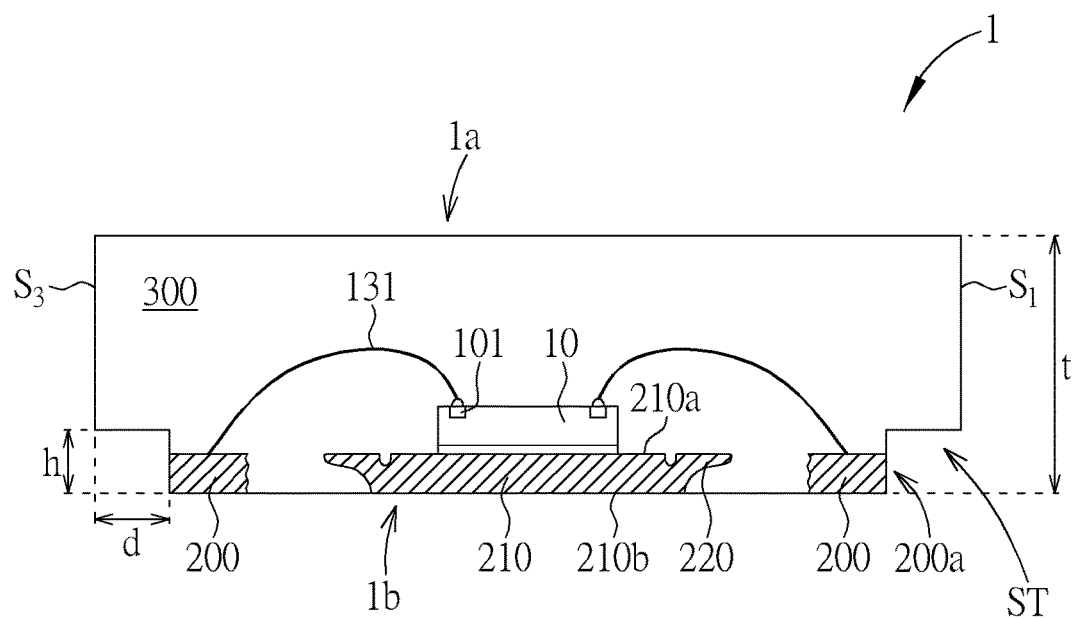
FIG. 1 is a schematic, cross-sectional diagram showing an exemplary leadframe chip package in accordance with an embodiment of the invention.

In the following detailed description of embodiments of the invention, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present invention is defined only by the appended claims.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

There are various leadframe-based surface mount components, such as quad flat no-lead (QFN) package, advanced QFN (aQFN) package, low-profile quad flat package (LQFP) or the like. A package can be attached to a printed circuit board (PCB) by, for example, soldering it to the PCB. The attachment of the packages (i.e. packaged integrated circuit) to PCBs produces printed circuit board assemblies (PCBAs), which can be used as motherboards in computers, portable devices such as mobile phone, tablets, notebooks, etc.

Generally, a leadframe strip is populated with a plurality of leadframes. A semiconductor die or microelectronic device may be mounted on each leadframe and encapsulated with a molding compound. Leadframes are separated during singulation of the strip to create individual semiconductor packages. One type of the semiconductor packages is a flat-pack no-lead package where each terminal is exposed at a bottom and at a side of the package. Typically, the sawing process during singulation of the strip typically results in lead terminals that have at least some exposed base metal on a cut end, or flank, of each lead terminal. Typically, the aforesaid cut end is vertically flush with a sidewall surface of the package or the sidewall surface of a molding compound.

The term of quad flat no-lead or small outline no-lead package indicates that the leads do not have cantilevered leads, but flat leads, which are typically arrayed along the periphery of the packaged device. The metal of the leads may be connected by solder material to the metal of respective contact pads of an external part. QFN packages typically use a copper leadframe for the die assembly and PCB interconnection.

Figure 2:
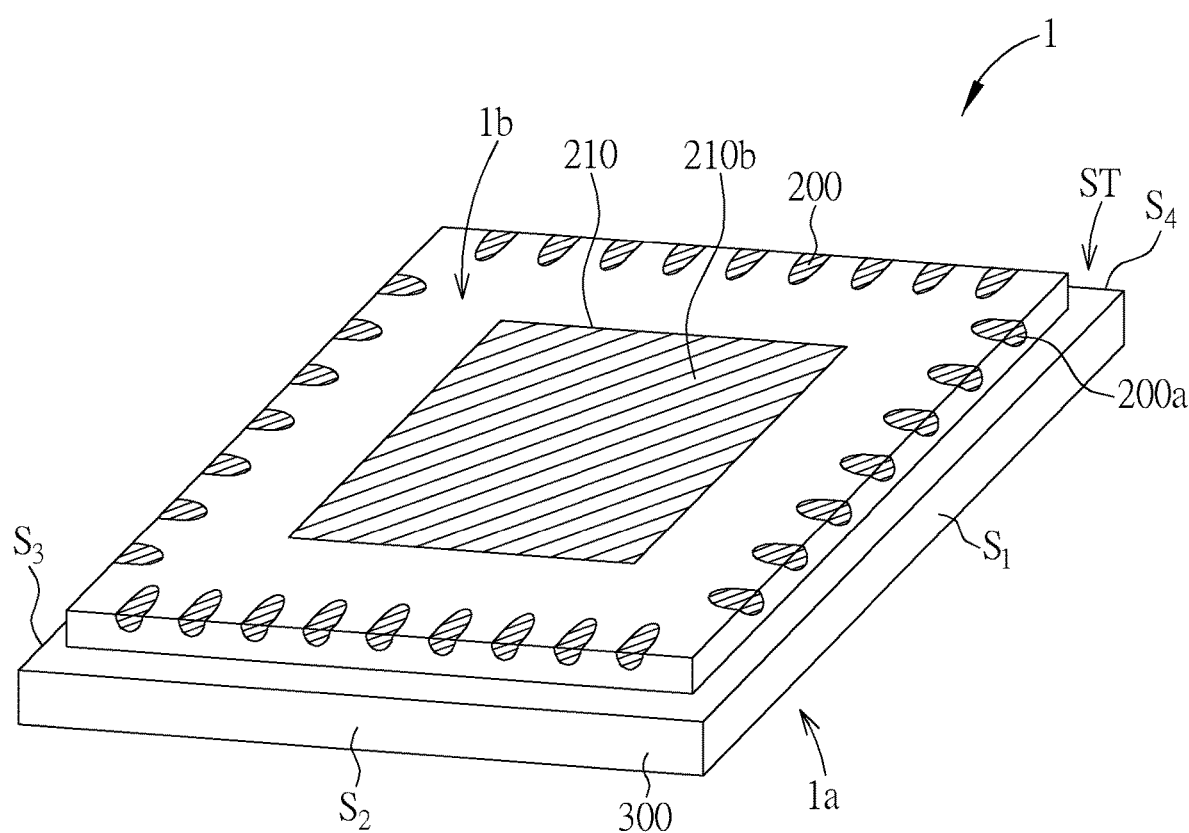
FIG. 2 is a perspective view of the flipped leadframe chip package of FIG. 1.

Please refer to FIG. 1 and FIG. 2. FIG. 1 is a schematic, cross-sectional diagram showing an exemplary leadframe chip package 1 in accordance with an embodiment of the invention. FIG. 2 is a perspective view of the flipped leadframe chip package 1 of FIG. 1. As shown in FIG. 1 and FIG. 2, the leadframe chip package 1 such as a QFN package may comprise a plurality of lead terminals (or pins) 200 disposed around a die attach pad 210 that is supported in a central region of the leadframe chip package 1. The leadframe chip package 1 may have a rectangular outline. The leadframe chip package 1 may have a top surface 1a, a bottom surface 1b, and four sidewalls $S_1$-$S_4$ between the top surface 1a and the bottom surface 1b. The first sidewall $S_1$ is opposite to the third sidewall $S_3$ and the second sidewall $S_2$ is opposite to the fourth sidewall $S_4$. Optionally, a ground ring 220 may be disposed between the plurality of lead terminals 200 and the die attach pad 210. It is to be understood that the number of lead terminals and dimension of the leadframe chip package are for illustration purposes only.

According to an embodiment, at least one semiconductor die 10 is mounted on a top surface 210a of the die attach pad 210. The semiconductor die 10 comprises a plurality of input/output (I/O) pads 101 disposed along the perimeter of the semiconductor die 10. According to an embodiment, for example, the I/O pads 101 of the semiconductor die 10 may be electrically connected to the lead terminals 200 by bond wires 131. The plurality of lead terminals 200, the semiconductor die 10, the bond wires 131, and the die attach pad 210 are encapsulated by a molding compound 300 comprising, for example, epoxy resin and filler. In some embodiments, the at least one semiconductor die 10 may be installed within the package in a flip-chip manner.

According to an embodiment, a step cut ST is sawn into the molding compound 300 along the perimeter of the bottom surface 1b of the leadframe chip package 1. The step cut ST may penetrate through an entire thickness of each of the plurality of lead terminals 200. Therefore, each of the plurality of lead terminals 200 has at least an exposed outer end 200a, or flank, at the step cut ST. The exposed outer ends 200a are retracted and shaded at the step cut ST and therefore do not present on the four sidewalls $S_1$-$S_4$ of the leadframe chip package 1.

According to an embodiment, the leadframe chip package 1 may have a thickness t that is greater than 0.4 mm. In other embodiments, the leadframe chip package 1 may have a thickness t of about 1.0-2.0 mm, for example, 1.4 mm. According to an embodiment, the step cut ST may have a height h of about 0.1-0.3 mm, for example, 0.2 mm, and a width d of about 0.2-0.4 mm, for example, 0.3 mm, but is not limited thereto. According to an embodiment, the height h of the step cut ST may be greater than a thickness of the plurality of lead terminals 200.

According to an embodiment, a bottom surface 210b of the die attach pad 210 may be exposed from the bottom surface 1b of the leadframe chip package 1 and may be connected to a ground plane and/or heat-dissipating plugs (not shown) in a printed circuit board (PCB). According to one embodiment, the ground ring 220 is half-etched from the bottom surface 1b and is not exposed from the bottom surface 1b of the leadframe chip package 1.

Figure 3:
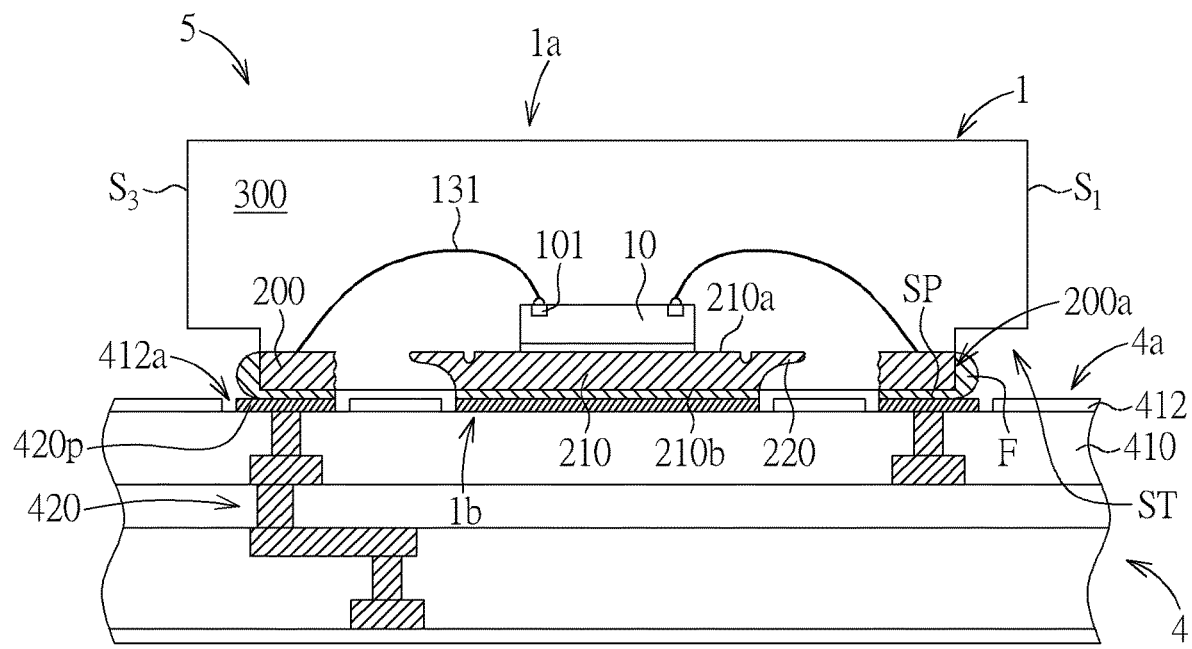
FIG. 3 is a schematic, cross-sectional diagram showing an exemplary printed circuit board assembly (PCBA) in accordance with one embodiment of the invention.
Figure 4:
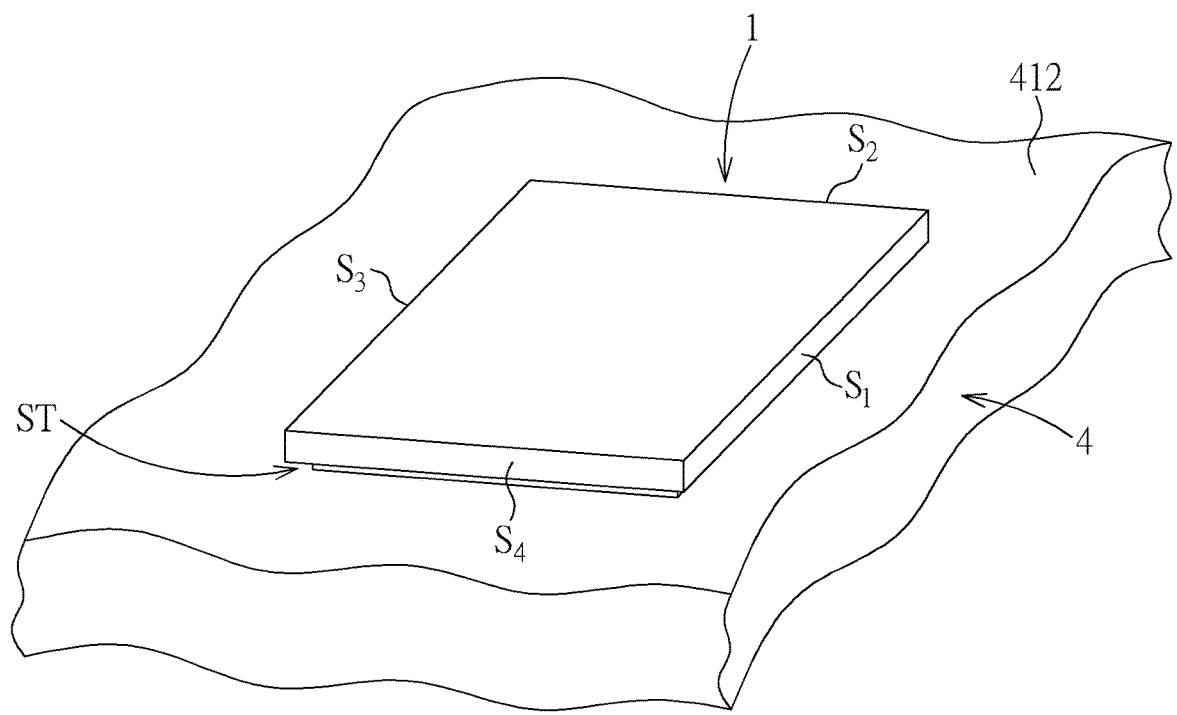
FIG. 4 is a perspective partial view of the PCBA in FIG. 3.

Please briefly to FIG. 3 and FIG. 4. FIG. 3 is a schematic, cross-sectional diagram showing an exemplary printed circuit board assembly (PCBA) in accordance with one embodiment of the invention. FIG. 4 is a perspective partial view of the PCBA in FIG. 3.

As shown in FIG. 3, the PCBA 5 comprises the leadframe chip package 1 as set forth in FIG. 1 and FIG. 2, and a printed circuit board 4. The leadframe chip package 1 is soldered to the printed circuit board 4. According to an embodiment, the printed circuit board 4 may be a laminated board made of insulating material layers 410 and layers of metal traces 420 such as copper traces separated by the insulating material layers 410. The metal traces 420 may function to establish electrical connections between devices mounted on the printed circuit board 4, conduct heat, or provide a ground. On a chip-mounting face 4a of the printed circuit board 4, bonding pads 420p are provided and solder openings 412a are formed in a solder mask 412 to define soldering regions on the bonding pads 420p, respectively.

To solder the leadframe chip package 1 to the printed circuit board 4, solder paste SP can be applied to the surface of the bonding pads 420p within the defined regions. The solder paste SP can be applied onto the printed circuit board 4 by stencil printing methods, but not limited thereto. After the application of solder paste SP, the leadframe chip package 1 can be positioned on the printed circuit board 4, and the PCBA 5 can be placed into an oven and heated. The heating cause the solder to melt, leading to wetting and wicking. The solder mask 412 on the printed circuit board 4 can control the solder paste SP during heating. The solder mask 412 is placed on the printed circuit board 4, and solder paste SP is applied to areas of the printed circuit board 4 to which the leadframe chip package 1 is to be attached that are not protected by the solder mask 412.

According to an embodiment, a solder fillet F may be observed on the exposed outer end 200a at the step cut ST. According to an embodiment, the solder fillet F does not protrude beyond the four sidewalls $S_1$-$S_4$. According to an embodiment, the solder fillet F is in direct contact with the exposed outer end 200a. According to an embodiment, the solder fillet F wicking up to the exposed outer end 200a may have a half-spherical profile or a curved outer surface, but is not limited thereto. As can be discerned from FIG. 4, the exposed outer end 200a and the solder fillet F are shaded by the molding compound 300 at the step cut ST. It is to be understood that in some embodiments the solder fillet F may not be observed on the exposed outer end 200a depending upon the design of the PCB.

Although the step cut ST shown in FIG. 2 is a continuous ring-shaped region recessed into the molding compound 300 along the perimeter of the bottom surface 1b of the leadframe chip package 1, it is understood that in some cases the step cut ST may be a discontinuous region depending upon the design requirements. FIG. 5A to FIG. 5F are bottom views of the leadframe chip packages according to various embodiments of the invention, wherein like layers, regions, or elements are designated by like numeral numbers or labels.

Figure 5A:
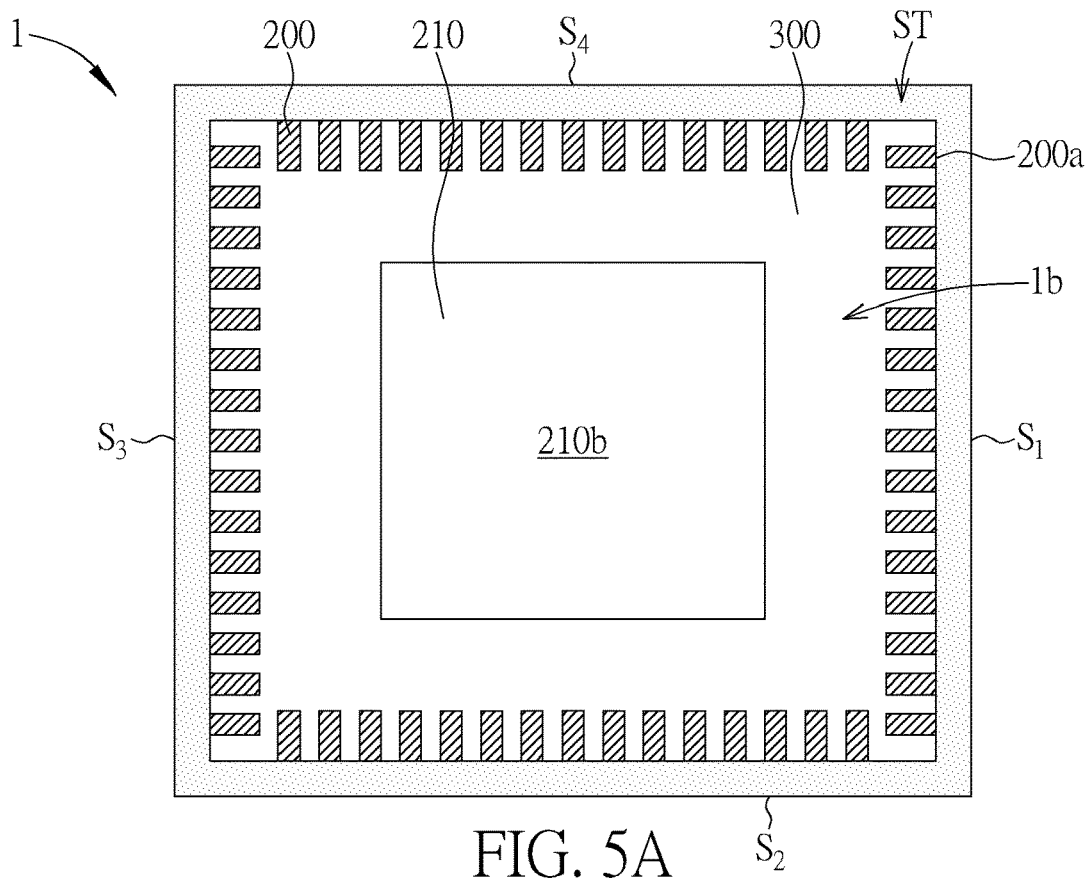
FIG. 5A to FIG. 5F are bottom views of the leadframe chip packages according to various embodiments of the invention.

As shown in FIG. 5A, the step cut ST is a continuous ring-shaped region recessed into the molding compound 300 along the perimeter of the bottom surface 1b of the leadframe chip package 1. The cut ends 200a of the lead terminals 200 are not exposed on the sidewalls $S_1$-$S_4$.

Figure 5B:
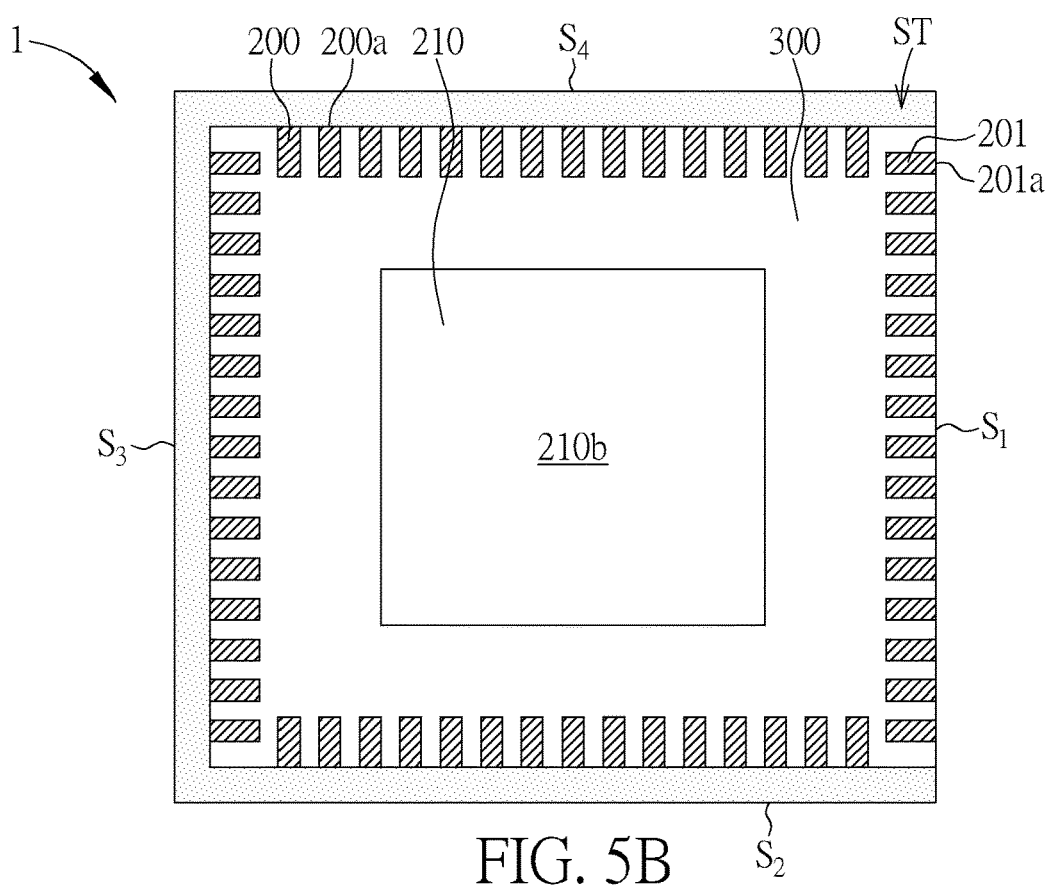

As shown in FIG. 5B, the step cut ST is a C-shaped region sawn into the molding compound 300 along the perimeter of the bottom surface 1b of the leadframe chip package 1 and is formed only under the three sidewalls $S_2$-$S_4$. The lead terminals 201 have cut ends 201a exposed from the sidewall $S_1$.

Figure 5C:
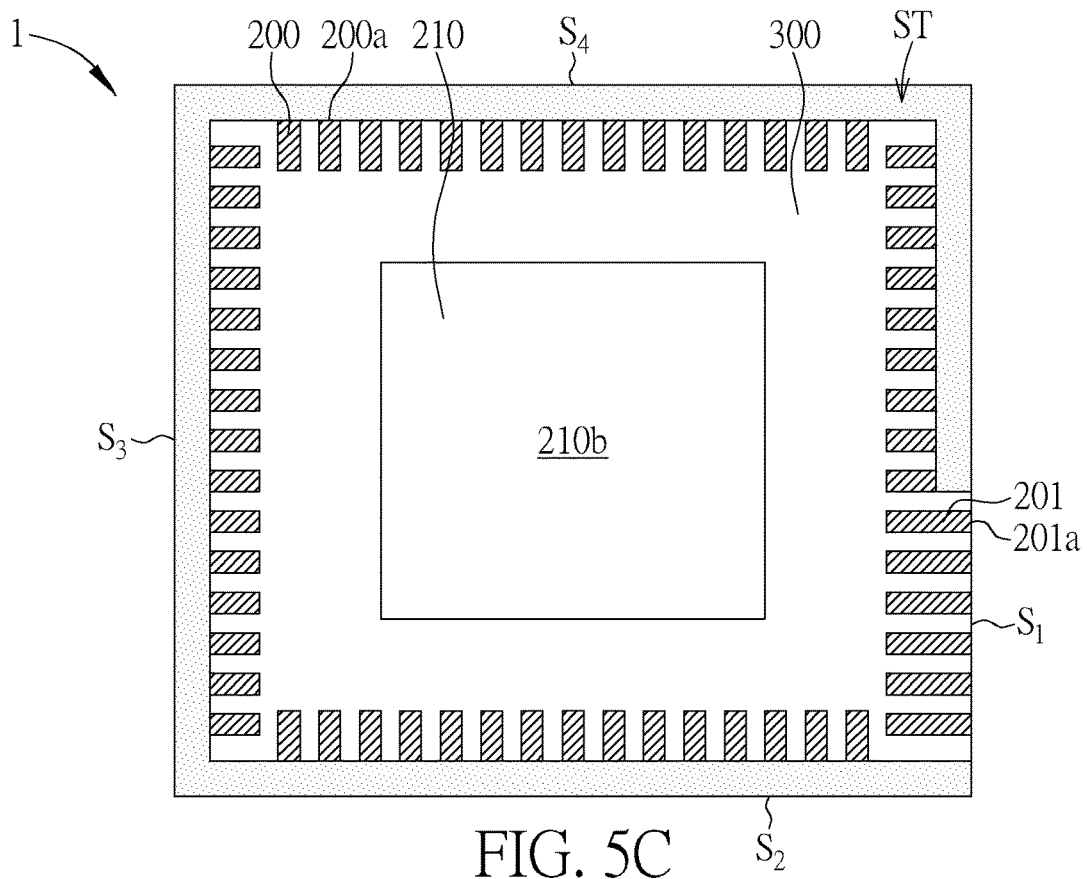

As shown in FIG. 5C, the step cut ST is a discontinuous ring-shaped region sawn into the molding compound 300 along the perimeter of the bottom surface 1b of the leadframe chip package 1. At the discontinuity, the lead terminals 201 have cut ends 201a exposed from the sidewall $S_1$. The lead terminals 201 may have a length that is different from that of the lead terminals 200.

Figure 5D:
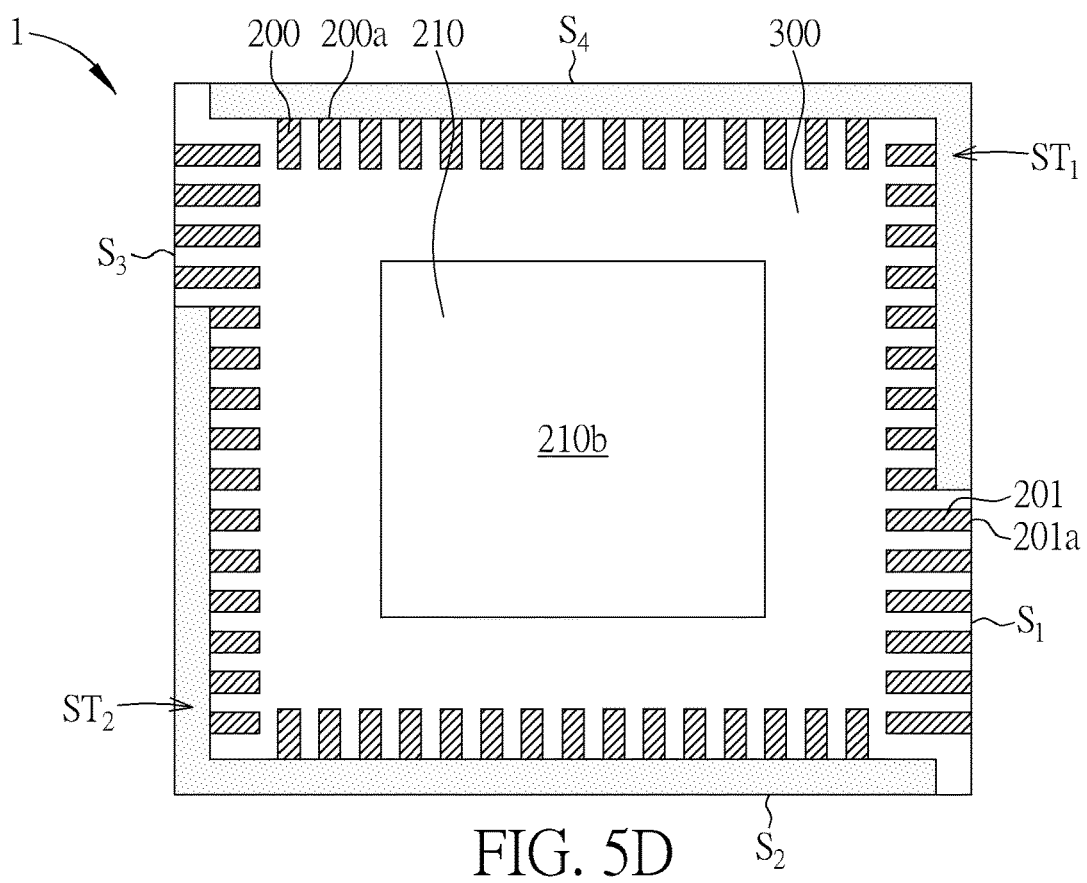

As shown in FIG. 5D, the leadframe chip package 1 comprises L-shaped step cut $ST_1$ and step cut $ST_2$ sawn into the molding compound 300 along the perimeter of the bottom surface 1b of the leadframe chip package 1. At the discontinuity, the lead terminals 201 have cut ends 201a exposed from the sidewalls $S_1$ and $S_3$. The lead terminals 201 may have a length that is different from that of the lead terminals 200.

Figure 5E:
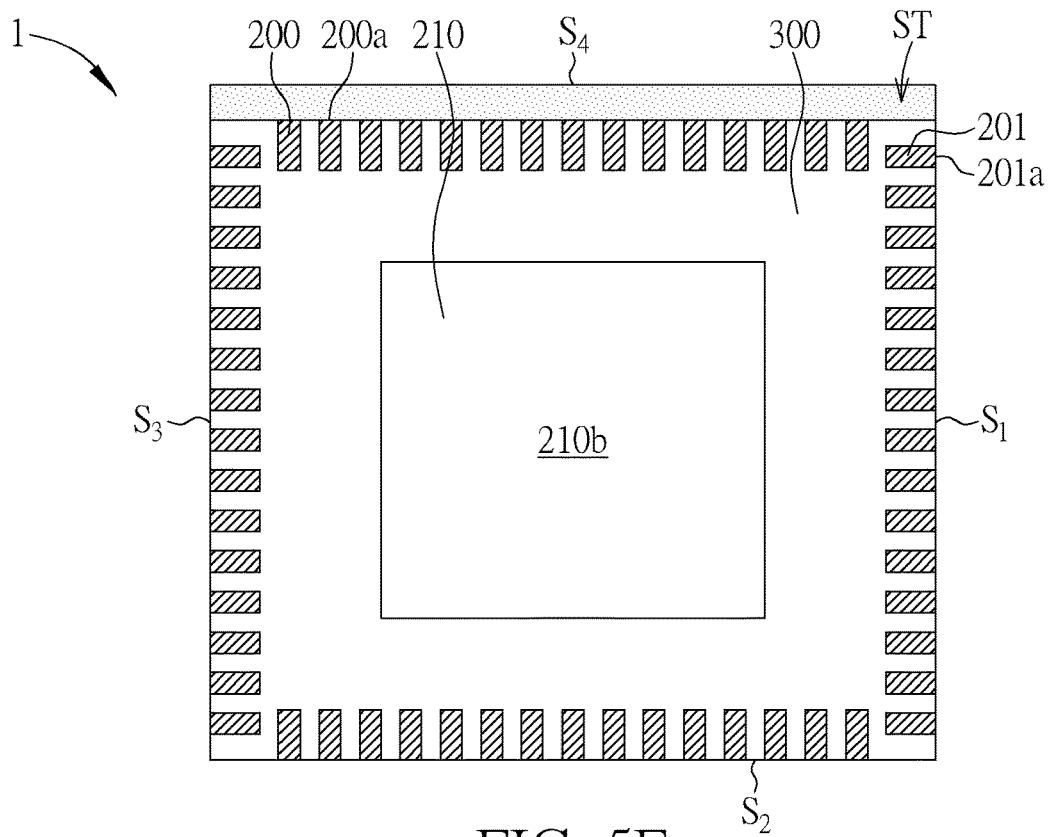

As shown in FIG. 5E, the leadframe chip package 1 comprises step cut ST only adjacent to the sidewall $S_4$. The lead terminals 201 have cut ends 201a exposed from the sidewalls $S_1$, $S_3$ and $S_2$.

Figure 5F:
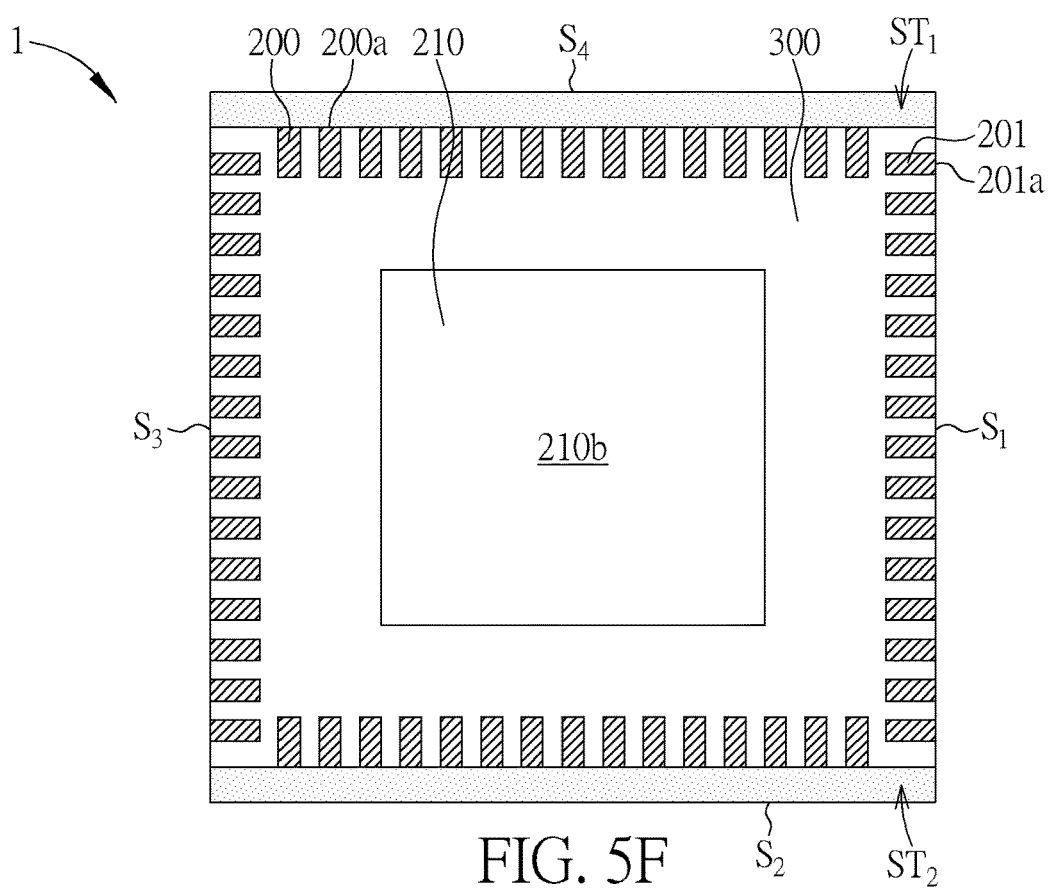

As shown in FIG. 5F, the leadframe chip package 1 comprises step cut $ST_1$ adjacent to the sidewall $S_4$ and step cut $ST_2$ adjacent to the sidewall $S_2$. The lead terminals 201 have cut ends 201a exposed from the sidewalls $S_1$ and $S_3$.

FIG. 6 to FIG. 10 are schematic, cross-sectional diagrams showing a method for fabricating the leadframe chip package 1 in FIG. 1 and FIG. 2 according to an embodiment of the invention, wherein like layers, regions, or elements are designated by like numeral numbers or labels.

Figure 6:
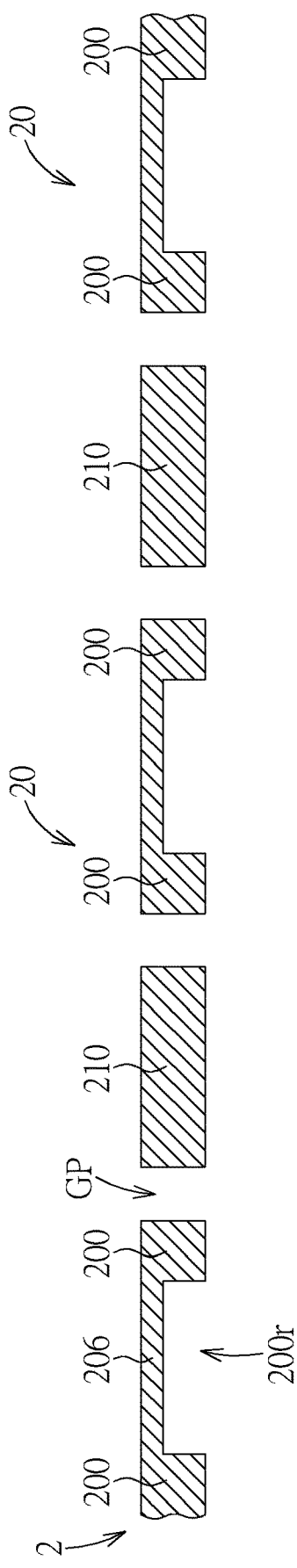
FIG. 6 to FIG. 10 are schematic, cross-sectional diagrams showing a method for fabricating the leadframe chip package in FIG. 1 and FIG. 2 according to an embodiment of the invention.

As shown in FIG. 6, a leadframe strip (or carrier) 2 populated with a plurality of leadframes 20 is provided. According to an embodiment, the leadframe strip 2 may be composed of a metal sheet or metal layer, for example, a copper layer. Each of the plurality of leadframes 20 comprises a die attach pad 210 supported in a central region and lead terminals 200 disposed around the die attach pad 210. Although not shown in the figures, it is understood that the die attach pad 210 may be supported by four tie-bars extending at the four corners and a gap GP may be formed between the die attach pad 210 and the lead terminals 200. According to an embodiment, the leadframes 20 may comprise half-etched regions 200r between the lead terminals 200. According to an embodiment, the half-etched regions 200r are disposed under connecting portions 206.

Figure 7:
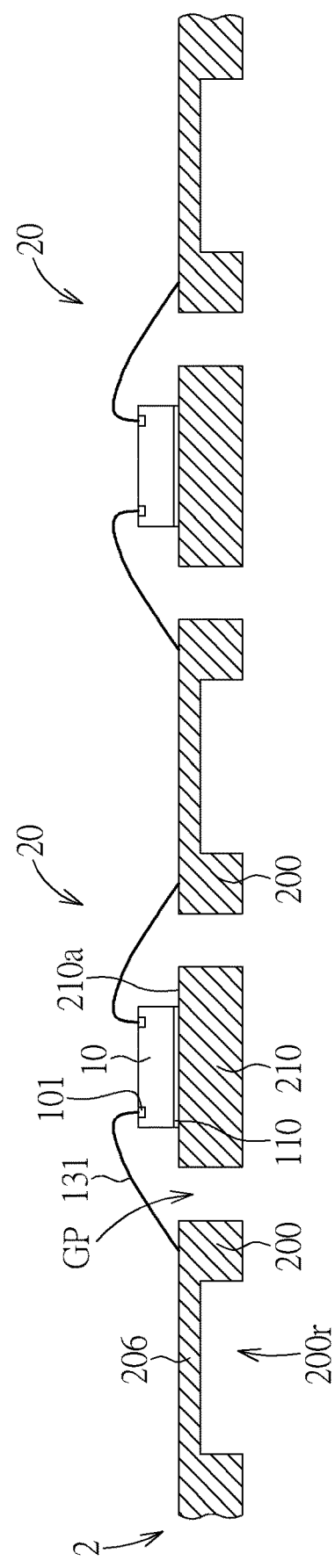

As shown in FIG. 7, a semiconductor die 10 is mounted on a top surface 210a of the die attach pad 210. For example, the semiconductor die 10 may be secured to the top surface 210a of the die attach pad 210 by using an adhesive layer 110, but is not limited thereto. The semiconductor die 10 comprises a plurality of I/O pads 101 disposed along the perimeter of the semiconductor die 10. According to an embodiment, for example, the I/O pads 101 of the semiconductor die 10 may be electrically connected to the lead terminals 200 by bond wires 131.

Figure 8:
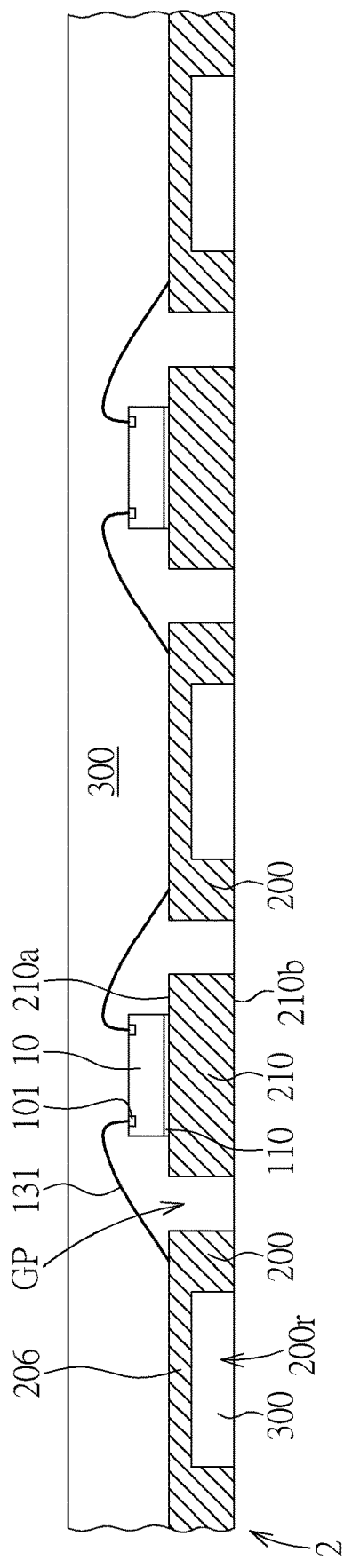

As shown in FIG. 8, the plurality of lead terminals 200, the semiconductor die 10, the bond wires 131, and the die attach pad 210 are encapsulated by a molding compound 300. According to an embodiment, the molding compound 300 may comprise, for example, epoxy resin and filler, but not limited thereto. According to an embodiment, a bottom surface 210b of the die attach pad 210 may be exposed. According to an embodiment, the half-etched regions 200r and the gap GP may be filled with the molding compound 300.

Figure 9:
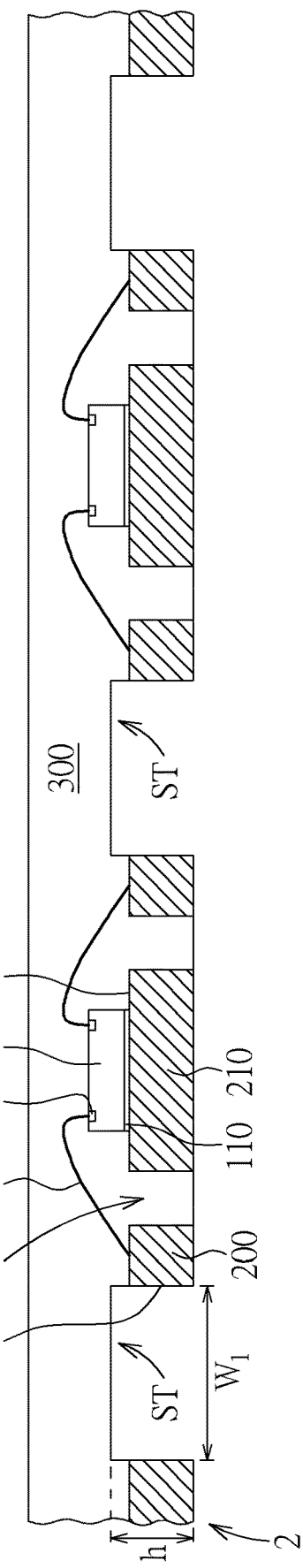

As shown in FIG. 9, a step cut ST is sawn into the molding compound 300 along the perimeter around the lead terminals 200. According to an embodiment, the molding compound 300 within the half-etched regions 200r is removed. According to an embodiment, the connecting portions 206 are removed. The step cut ST may be formed by using a step cut saw width $W_1$. According to an embodiment, the step cut saw width $W_1$ may be approximately 0.9 mm, but not limited thereto. According to an embodiment, the step cut ST may have a height h of about 0.1-0.3 mm, for example, 0.2 mm. According to an embodiment, the height h of the step cut ST may be greater than a thickness of the plurality of lead terminals 200. According to an embodiment, after the step cut ST is formed, each of the lead terminals 200 has an exposed outer end 200a, or flank, at the step cut ST.

Figure 10:
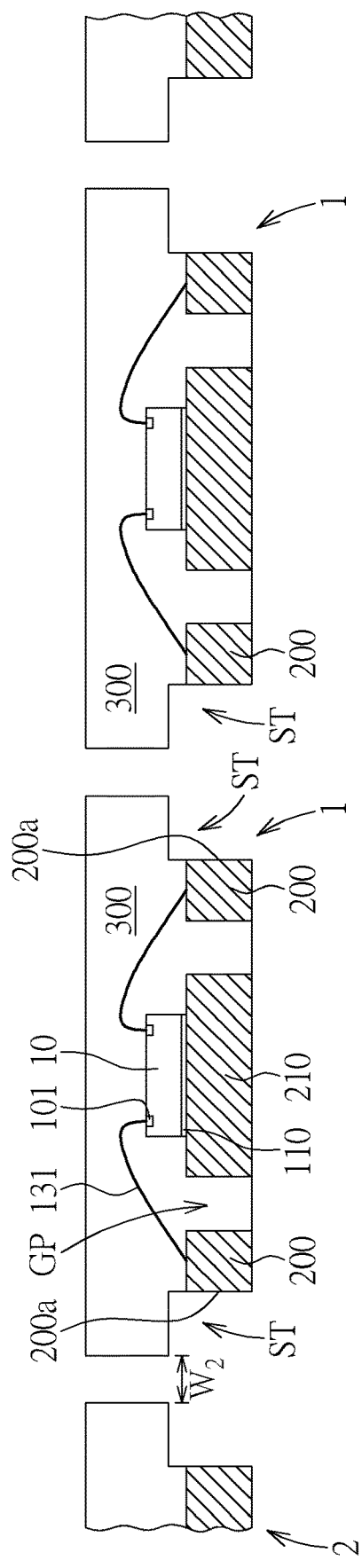

As shown in FIG. 10, subsequently, a sawing process is performed to saw through the molding compound 300 along the step cut ST. According to an embodiment, the sawing process may be performed using a saw width $W_2$ less than the step cut saw width $W_1$. In some embodiments, the saw width $W_2$ is approximately 0.2-0.4 mm, for example, 0.3 mm.

FIG. 11 to FIG. 15 are schematic, cross-sectional diagrams showing a method for fabricating a leadframe chip package according to another embodiment of the invention, wherein like layers, regions, or elements are designated by like numeral numbers or labels.

Figure 11:
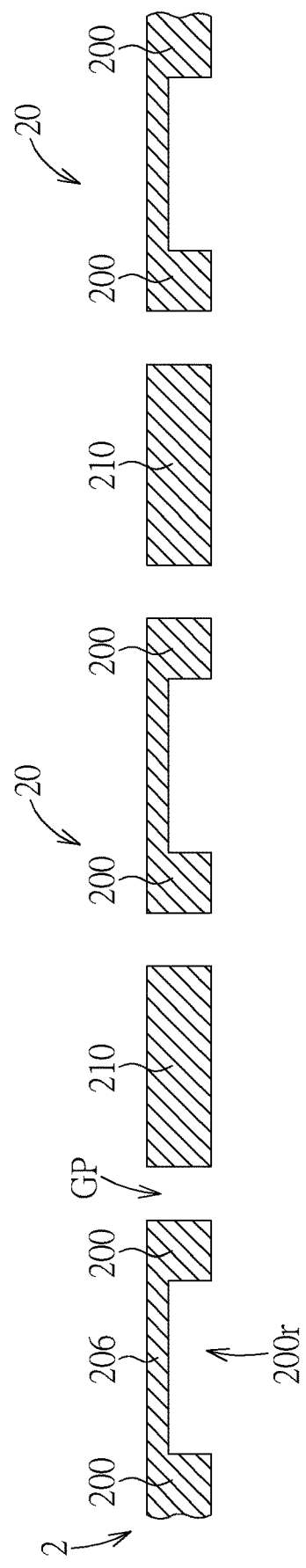
FIG. 11 to FIG. 15 are schematic, cross-sectional diagrams showing a method for fabricating a leadframe chip package according to another embodiment of the invention.

As shown in FIG. 11, a leadframe strip 2 populated with a plurality of leadframes 20 is provided. Each of the plurality of leadframes 20 comprises a die attach pad 210 supported in a central region and lead terminals 200 disposed around the die attach pad 210. Although not shown in the figures, it is understood that the die attach pad 210 may be supported by four tie-bars extending at the four corners and a gap GP may be formed between the die attach pad 210 and the lead terminals 200. According to an embodiment, the leadframes 20 may comprise half-etched regions 200r between the lead terminals 200. According to an embodiment, the half-etched regions 200r are disposed under connecting portions 206.

Figure 12:
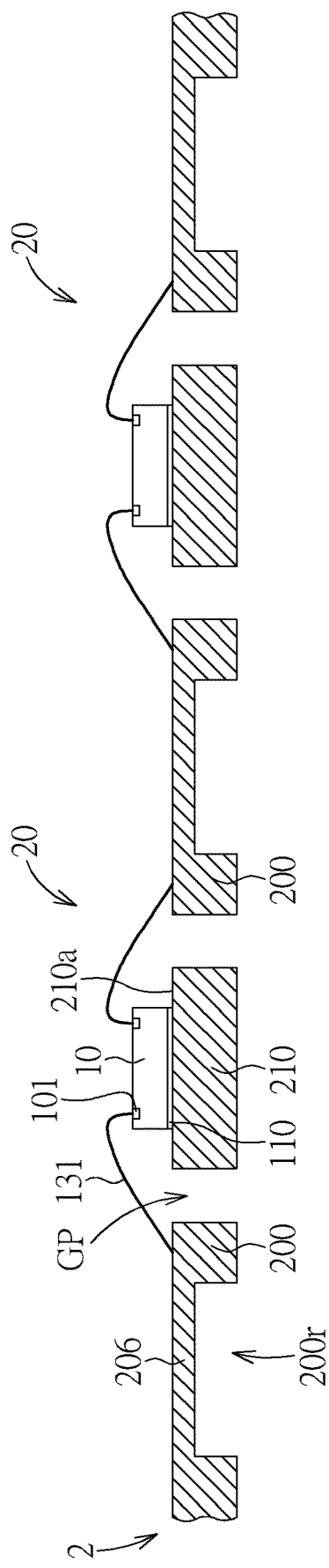

As shown in FIG. 12, a semiconductor die 10 is mounted on a top surface 210a of the die attach pad 210. For example, the semiconductor die 10 may be secured to the top surface 210a of the die attach pad 210 by using an adhesive layer 110, but is not limited thereto. The semiconductor die 10 comprises a plurality of I/O pads 101 disposed along the perimeter of the semiconductor die 10. According to an embodiment, for example, the I/O pads 101 of the semiconductor die 10 may be electrically connected to the lead terminals 200 by bond wires 131.

Figure 13:
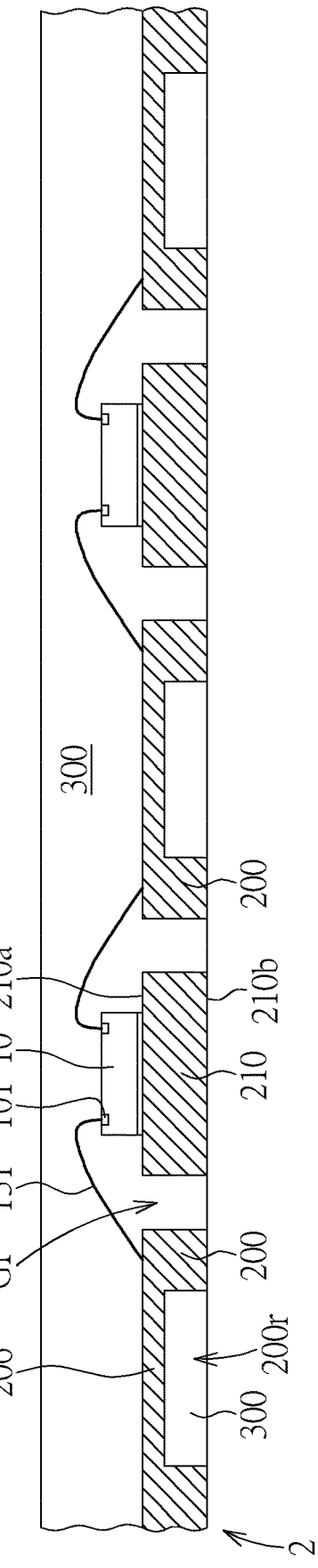

As shown in FIG. 13, the plurality of lead terminals 200, the semiconductor die 10, the bond wires 131, and the die attach pad 210 are encapsulated by a molding compound 300. According to an embodiment, the molding compound 300 may comprise, for example, epoxy resin and filler, but not limited thereto. According to an embodiment, a bottom surface 210b of the die attach pad 210 may be exposed. According to an embodiment, the half-etched regions 200r and the gap GP may be filled with the molding compound 300.

Figure 14:
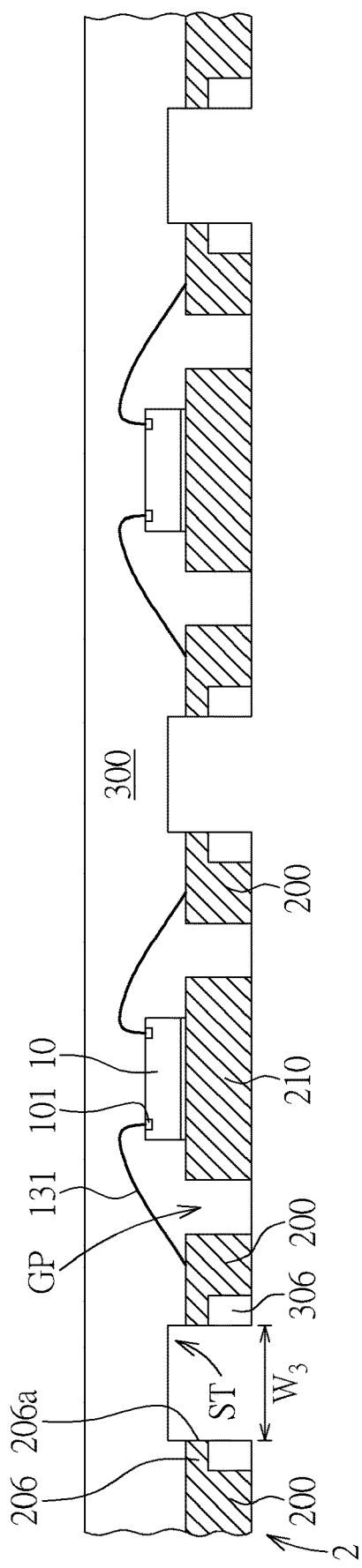

As shown in FIG. 14, a step cut ST is sawn into the molding compound 300 along the perimeter around the lead terminals 200. The step cut ST may be formed by using a step cut saw width $W_3$. According to an embodiment, the step cut saw width $W_3$ may be smaller than 0.9 mm, but not limited thereto. According to an embodiment, the step cut ST may have a height h of about 0.1-0.3 mm, for example, 0.2 mm. According to an embodiment, the height h of the step cut ST may be greater than a thickness of the plurality of lead terminals 200. According to an embodiment, the molding compound 300 within the half-etched regions 200r is not completely removed. The remaining portion 306 of the molding compound 300 within the half-etched regions 200r masks the side surface of the lead terminals 200. According to an embodiment, the connecting portions 206 are cut through, thereby exposing the end surfaces 206a above the remaining portion 306 of the molding compound 300 within the half-etched regions 200r.

Figure 15:
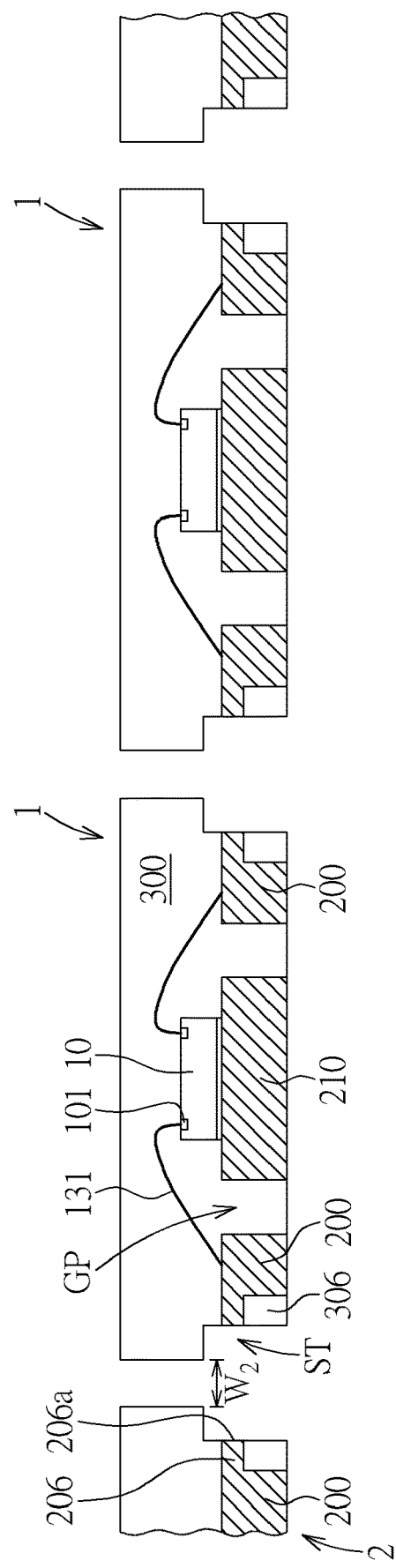

As shown in FIG. 15, subsequently, a sawing process is performed to saw through the molding compound 300 along the step cut ST. According to an embodiment, the sawing process may be performed using a saw width $W_2$ less than the step cut saw width $W_3$.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor package, comprising:
   providing a leadframe strip populated with a plurality of leadframes, wherein each of the plurality of leadframes comprises a die attach pad supported in a central region and lead terminals disposed around the die attach pad;
   mounting a semiconductor die on the die attach pad;
   electrically coupling the semiconductor die with the lead terminals;
   encapsulating the lead terminals, the semiconductor die, and the die attach pad with a molding compound;
   sawing a step cut into the molding compound along a perimeter around the lead terminals using a step cut saw width, wherein the step cut penetrates through an entire thickness of each of the lead terminals, whereby each of the lead terminals has at least an exposed outer end at the step cut, wherein a remaining portion of the molding compound masks an outer vertical side surface of each of the lead terminals; and
   performing a sawing process to saw through the molding compound along the step cut using a saw width, wherein the step cut saw width is wider than the saw width.

2. The method according to claim 1, wherein the semiconductor die comprises a plurality of input/output (I/O) pads disposed along a perimeter of the semiconductor die, and wherein the plurality of I/O pads of the semiconductor die is electrically connected to the lead terminals by bond wires.

3. The method according to claim 1, wherein the leadframes comprise half-etched regions between the lead terminals.

4. The method according to claim 3, wherein the lead terminals are connected by connecting portions, and wherein the half-etched regions are disposed under the connecting portions.

5. The method according to claim 4, wherein the molding compound within the half-etched regions is removed, and the connecting portions are removed when sawing the step cut into the molding compound.

6. The method according to claim 1, wherein the step cut saw width is approximately 0.9 mm and the saw width is approximately 0.2-0.4 mm.

\* \* \* \* \*